United States Patent [19]

McEnroe et al.

[11] Patent Number: 4,970,725
[45] Date of Patent: Nov. 13, 1990

[54] AUTOMATED SYSTEM TESTABILITY ASSESSMENT METHOD

[75] Inventors: Martin P. McEnroe; Laura L. Hilderbrand, both of Columbia, Md.

[73] Assignee: Westinghouse Electric Corp., Pittsburgh, Pa.

[21] Appl. No.: 323,023

[22] Filed: Mar. 14, 1989

[51] Int. Cl.$^5$ .................. G06F 15/00; G06F 11/00
[52] U.S. Cl. ............................. 371/15.1; 364/551.01; 364/200
[58] Field of Search ............... 371/7, 8.1, 9.1, 15.1; 364/551.01, 552, 579, 580, 285, 285.3, 285.4, 513, 900

[56] References Cited

U.S. PATENT DOCUMENTS

| | | |
|---|---|---|
| 4,649,515 | 3/1987 | Thompson et al. ............ 364/900 |
| 4,841,456 | 6/1989 | Hogan, Jr. et al. ............ 364/550 |
| 4,866,635 | 9/1989 | Kahn et al. ................... 364/513 |

Primary Examiner—Charles E. Atkinson
Attorney, Agent, or Firm—W. G. Sutcliff

[57] ABSTRACT

A procedure for calculating maintainability and testability parameters of a complex system uses computer software to enable the calculations to be made repeatedly during the development of the system. Failure modes and failure rates, elemental task times and test path data from a branching test flow diagram are input. Screens which identify the data to be input are displayed for ease of data entry. A hierarchical relationship between the modules in the system can be entered so that failure modes and failure rates need only be entered for lowest level modules. The procedure iteratively calculates maintainability and testability parameters starting at the lowest level and using previously calculated data in the next highest level. Fault isolation ambiguity is automatically taken into account by ordering the modules in descending order of total test path/module failure rate isolated by each test path. The ordered data are used in many of the calculations of the maintainability and testability parameters.

19 Claims, 2 Drawing Sheets

Microfiche Appendix Included
(1 Microfiche, 40 Pages)

AUTOMATED SYSTEM TESTABILITY ASSESSMENT METHOD

REFERENCE TO MICROFICHE APPENDIX

A microfiche appendix consisting of 40 frames on one fiche is part of this application.

BACKGROUND OF THE INVENTION

1. Field of the Invention

The present invention is related to the assessment of testability and maintainability of a complex system and, more particularly, to an automated system for receiving estimates of failure rates and maintenance task times for individual modules and automatically calculating testability and maintainability parameters of a system composed of the modules.

2. Description of the Related Art

Organizations involved in the development of complex systems typically require that failures in the system be identifiable and repairable within a given amount of time. In determining whether these system level parameters are met, assumptions of the failure rate, testing time and replacement time are developed for each of the modules or replaceable items in the system and a series of calculations are required to be performed to generate the values of the testability and maintainability parameters. One example of the type of parameters and calculations required to determine the value of those parameters is set forth in PROCEDURE V of the standard MIL-HDBK-472, incorporated herein by reference, which was issued by the Department of Defense in January, 1984.

As noted in the MIL-HDBK-472 standard, PROCEDURE V can be applied to virtually any type of equipment including mechanical equipment, although the standard was issued for application to avionics, ground and shipboard electronics. In controlling the development of such complex systems, it is desirable to verify, to the extent possible, that the equipment can be maintained in a timely fashion. Rather than permitting the designers of the system to "pull numbers out of the air," PROCEDURE V of MIL-HDBK-472 standard requires that actual or estimated data be provided for each of the primary replaceable items, including an identification of all known failure modes of each of the replaceable items, the failure rate associated with that failure mode, the maintenance procedure used to remove and replace each replaceable item and the fault detection-/isolation test strategy for the system.

The failure modes identify categories of failures which are known as possibly occurring in the replaceable items. Taking a simple example, a temperature-controlled switch, such as a thermostat controlling a heater, can fail high so that the heater runs continuously or can fail low so that the heater remains off regardless of the temperature. These are two possible failure modes of a temperature-controlled switch. The failure rates associated with these modes represent how often each type of failure can be expected to occur. The values of the failure rates would be based upon actual experience if the same temperature-controlled switch has been used in other applications or similar switches have been used in similar applications. In this manner, an evaluation of the modes of failure and the rates of failure associated with each mode is provided for each module or replaceable item in, e.g., a complex avionics system as an initial step of meeting the requirements of PROCEDURE V.

The basic fault detection and isolation outputs test strategy described in PROCEDURE V of MIL-HDBK-472 only describes a single set of tests directly connected to termination nodes identifying a replaceable item and having a failure rate and a maintenance activity block associated therewith. The activity block identifies the maintenance procedure. Each step in the maintenance procedure is referred to as an elemental task and the average or mean time required to perform the elemental task is estimated to provide information for time line analysis.

PROCEDURE V of the MIL-HDBK-472 standard provides a large number of formulas to calculate maintainability parameters such as mean time to repair (MTTR); average repair time for each replaceable item; percent isolation to a single replaceable item and to a group of replaceable items; mean maintenance man hours per repair, per maintenance action, per operating hour and per flight hour (in the case of avionics); and the, e.g., ninety-fifth percentile of the corrective maintenance times. However, PROCEDURE V only contemplates manual calculation of these parameters and no attempt is made to minimize redundant steps or provide efficient calculation techniques. During the development of a system, the parameters ideally should be recalculated as additional information is gained regarding the characteristics, i.e., failure modes, failure rates, elemental task times, etc., of the modules to verify that the system requirements are being met. Repeated iteration of the calculations is not addressed except by providing for both approximate (PROCEDURE V.A) and detailed (PROCEDURE V.B) calculations. By requiring excessive time and effort, PROCEDURE V virtually guarantees that calculations will be performed as few times as possible.

In addition, PROCEDURE V.B. does not address the subject of iterative replacement. Under iterative replacement, if three modules were suspect, the first module would be replaced and tests run to see if the system failure was fixed. If not, the second suspect module is replaced and repair is verified. The third module would be replaced only if the failure was still not fixed. The alternative to iterative replacement is group replacement. For group replacement the maintainer always replaces all three suspect modules, then verifies that the failure has been fixed. Since it is most likely that only one of those three modules actually has a fault, much wasted effort is incurred in handling and attempting to fix the two good modules. Notwithstanding the increased logistics cost, elementary probability shows that iterative replacement is superior to group replacement in any system with reasonable self-testing ability, such as modern complex electronic systems.

Furthermore, the equations presented in PROCEDURE V.B are wholly inadequate in addressing iterative replacements. In addition, there are many other useful parameters which can be obtained from the data required for PROCEDURE V and more parameters can be obtained with the addition of data that can be relatively easily supplied in addition to the required data.

SUMMARY OF THE INVENTION

An object of the invention is to provide a practical procedure for obtaining maintainability and testability parameters of a complex system.

A further object of the present invention is to provide a procedure for obtaining maintainability and testability parameters using conventional branching test flow diagrams to provide some of the input to the procedure.

A still further object of the present invention is to provide a procedure for obtaining maintainability and testability parameters using a mixture of automatic and manual tests as well as being adaptable to use with an expert system rule base.

Yet another object of the present invention is to provide a computerized procedure for obtaining maintainability and testability parameters of a complex system.

A further object of the present invention is to provide a procedure for obtaining maintainability and testability parameters of a system having multiple maintenance levels which require the input of failure data only for the modules corresponding to the lowest maintenance level.

A still further object of the present invention is to provide a procedure for obtaining testability parameters for each method of testing used in testing a complex system.

Yet another object of the present invention is to provide a procedure for identifying an order for replacing modules in a complex system when more than one module is isolated by a test path.

The above objects are attained by providing a process for automatically determining at least one of testability and maintainability parameters of a system composed of modules, comprising the steps of inputting failure rate data specifying a failure rate for at least one failure mode of at least one module, detected by each test path performable during testing of the system; automatically ordering the modules for each of the failure modes detected by each test path in descending order of the failure rate corresponding thereto; and identifying, for each test path, an order for iterative repair of the modules for each of the failure modes detected by the test path, in dependence upon the previous performed ordering.

Preferably, the procedure also includes calculating testability parameters including percentage of successful fault isolations accomplishable using each method of testing applied to the system and requiring replacement of n modules, where n is an integer and the calculations are performed for n equals one and meaningful incremental increases up to the number of modules in the system. Preferably, the process also includes calculating maintainability parameters using elemental task times corresponding to maintenance tasks performed during replacement of one of the modules and the preferred ordering of the modules for repair. Also, the procedure preferably permits a hierarchical relationship between modules to define maintenance levels, so that failure data can be input for the lowest level modules only and used to calculate both maintainability and testability parameters at all of the maintenance levels in the hierarchical relationship.

These objects, together with other objects and advantages which will be subsequently apparent, reside in the details of construction and operation as more fully hereinafter described and claimed, reference being had to the accompanying drawings forming a part hereof, wherein like reference numerals refer to like parts throughout.

DESCRIPTION OF THE PREFERRED EMBODIMENT

The procedure according to the present invention is designed for ease of use by engineers developing a complex system with as many as thousands of modules. This procedure enables the required testability and maintainability parameters to be calculated repeatedly during development of a system with relatively little effort on the part of an engineering team. Certain assumptions are made which may not reflect actual experience when the system being developed is put into use, but these assumptions simplify the calculations, enable comparison with similar systems and are recognized as reasonable by PROCEDURE V of MIL-HDBK-472. The major assumptions are that only a single fault occurs at any given time and that the skill, training level and attentiveness of technicians working on the system is appropriate and consistent.

Figure 1:
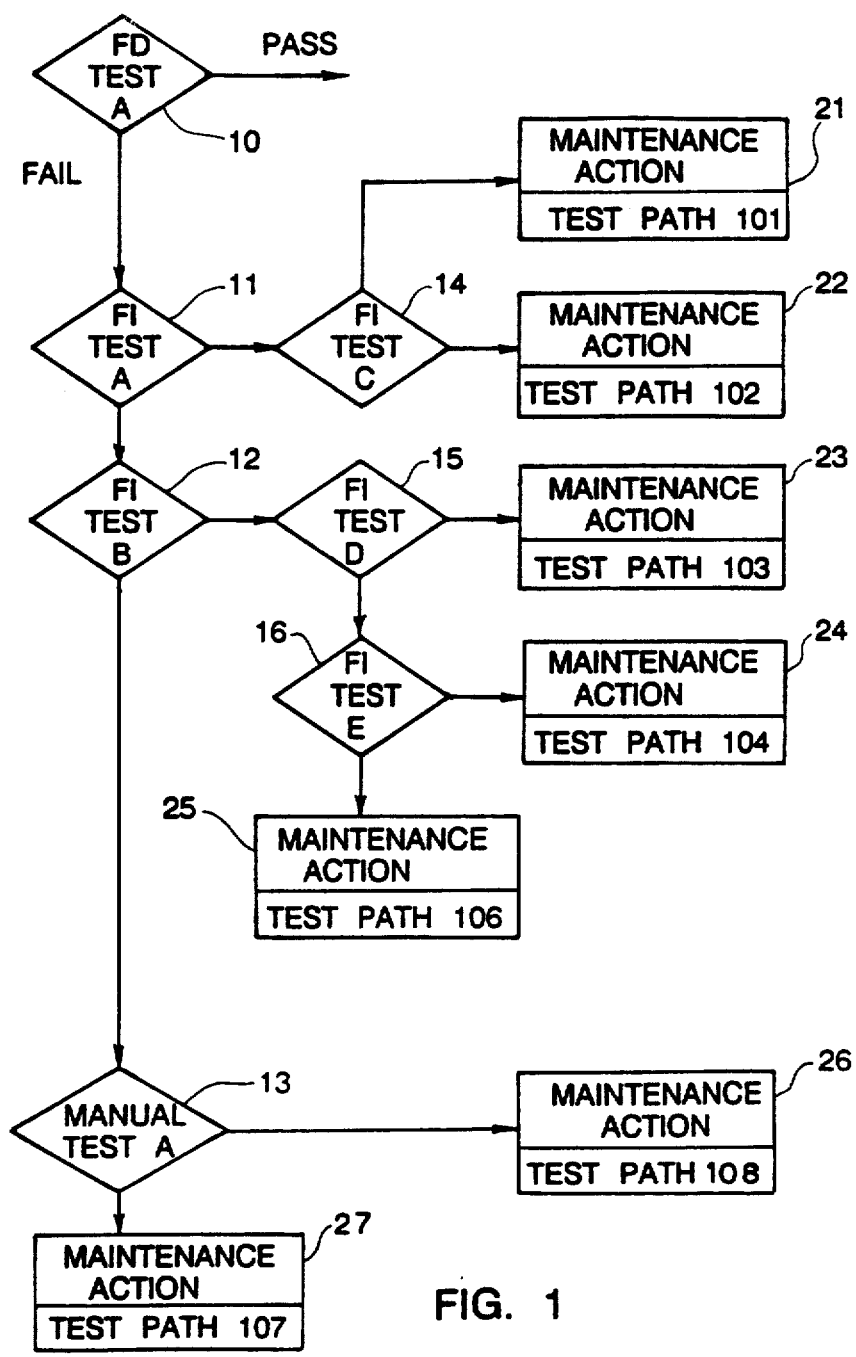
FIG. 1 is a branching test flow diagram used to identify inputs to a procedure according to the present invention.

To minimize the effort required by engineers using the procedure, one of the first steps in the procedure permits an engineer to use a test flow diagram produced by an engineer or engineering team. A portion of a conventional test flow diagram is illustrated in FIG. 1. Decision block 10 represents a failure detection test which if failed causes the test flow to enter the illustrated portion of the test flow diagram. A series of fault isolation tests 11-16 are executed as necessary. While binary fault isolation tests 11-16 are illustrated for simplicity in illustration, fault isolation tests which have multiple possible output states can be used.

The branching nodes 10-16 in the test flow diagram direct flow through the diagram to termination nodes 21-27. As illustrated in FIG. 1, each termination node 21-27 corresponds to a maintenance action and is identified by a test path identifier, because each termination node corresponds to a unique test path through the test flow diagram. In a test flow diagram for a real system, the branching nodes 10-16 and termination nodes 21-27 would have a more descriptive textual content instead of "MAINTENANCE ACTION." Other ways of identifying test paths can also be used. For example, the termination nodes in an expert system rule base can be input as test path identifiers.

Another input to the procedure according to the present invention uses data which is generated by engineering teams independently of the data required to calculate maintainability and testability parameters. A hierarchical relationship between the modules is one of the basic features of any complex system and is often used to develop a maintenance concept where different levels of modules are repaired or replaced at different maintenance locations. In the case of an avionic system, for example, the highest level of module replacement may occur between plane and flight line. Middle level modules might be replaced at a hangar near the flight line. Finally, a centralized maintenance facility might be used to repair the lowest levels of modules such as circuit boards.

Once the hierarchical relationship between the modules has been determined, failure modes and failure rates for each of the lowest level modules need to be estimated. This can be accomplished in the manner described above based upon experience with the same or similar modules in similar applications. In addition, elemental task times must be developed for each of the modules in the system. These elemental tasks relate to the functions performed in removing and replacing a module or replaceable item. Some of the elemental tasks identified in PROCEDURE V of MIL-HDBK-472 include disassembly (the time associated with gaining access to the replaceable item or items identified during the fault isolation process), interchange (the time associated with the removal and replacement of a faulty replaceable item or suspected faulty item), reassembly (the time associated with closing up the equipment after interchange is performed), alignment (the time associated with aligning or tuning the system or replaceable item after a fault has been corrected), checkout (the time associated with the verification that a fault has been corrected and that the system is operational) and start-up (the time associated with bringing a system up to the operational state it was in prior to failure once a fault has been corrected and the operational status of the system verified).

Figure 2:
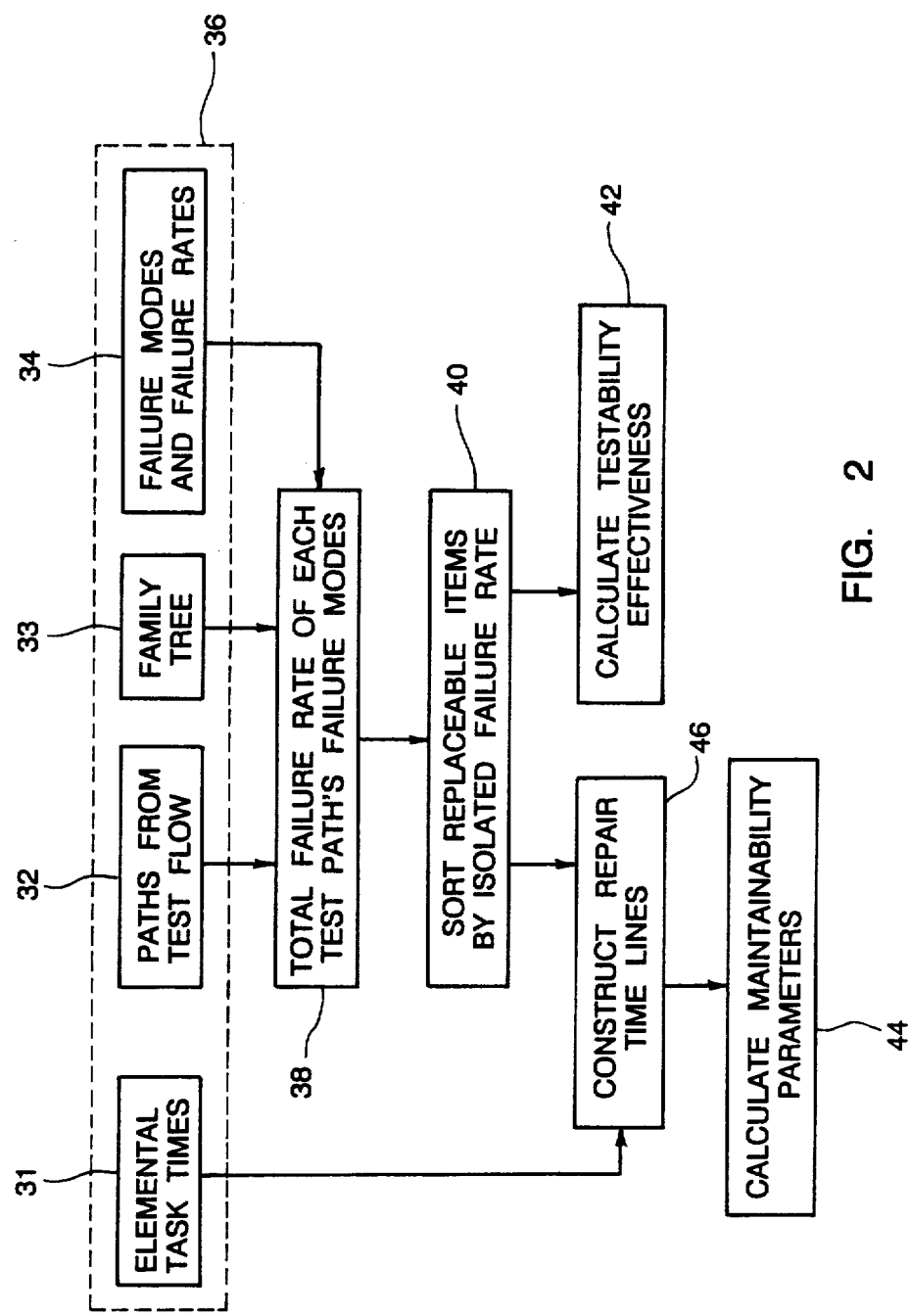
FIG. 2 is a block diagram of a procedure according to the present invention.

Once the engineering team has developed the required data, the data can be input to computer software. A block diagram of the steps performed by the computer software in the procedure according to the present invention is illustrated in FIG. 2. The input data 31-34 discussed above is input 36. Preferably, the computer software displays input screens to simplify the process of inputting data and includes menus for maneuvering between input screens and execution screens and for copying data corresponding to similar lower level modules in different higher level modules. Examples of menu screens are provided in the microfiche appendix (discussed in more detail below) at lines 594-994 of the TOP file, lines 258-347 of the WRA file and lines 279-443 of the SRA file. Examples of menu choices can be found at lines 54-79 of the TOP file, lines 221-223 of the WRA file and lines 151-162 of the SRA file. The input screens preferably include at least one screen for each module in the lowest level of the hierarchical relationship, including fields for input of failure mode, failure rate, percent failure contribution, at least one method of fault detection/isolation and a test path identifier.

Preferably, a single screen will include fields for several failure modes of one module with additional fields for each of the other items of data corresponding to that failure mode. An example for one module or replaceable item which will hereafter be referred to as RI-5, is provided below in Table 1. Similar screens can be used for inputting the elemental task times 31, test path data 32 and the hierarchical relationship of the modules or family tree 33 of the system. The computer software preferably includes error checking routines with instructions to guide the engineer and minimize errors which would invalidate results. For example, fault isolation should never exceed 100%.

TABLE 1

| Failure Mode | Failure Rate | % Failure Contribution | Fault Detection Testing Method | Isolation Test Path |
|---|---|---|---|---|
| CPU | 12.784 | 100% | On & Off-Line | 103 |
| Data Bus | 1.853 | 100% | Manual | 107 |
| Driver | 6.319 | 100% | On & Off-Line | 106 |

TABLE 1-continued

| Failure Mode | Failure Rate | % Failure Contribution | Fault Detection Testing Method | Isolation Test Path |
|---|---|---|---|---|
| Memory Bank | 14.580 | 90% | On & Off-Line | 106 |
| Memory Bank | 14.580 | 10% | Non-Relevant | N |
| Capacitor Open | 0.381 | 50% | None | N |
| Capacitor Short | 0.381 | 50% | On & Off-LIne | 105 |
| Indicator Light | 0.310 | 100% | Manual | 108 |

One implementation of the present invention used LOTUS 1-2-3 for the input, manipulation and output of data. The LOTUS command language statements and some of the data of three files (TOP, WRA and SRA) are provided in the microfiche appendix. The last frame in the microfiche appendix lists formulas which are used at lines 447-455 of the SRA file. In this particular implementation of the present invention, there are two levels of modules corresponding to maintenance on the flight line and at a nearby hangar. Each of the higher level modules has a WRA file corresponding thereto and each WRA file is associated with several SRA files each of which corresponds to a lowest level module. The TOP file contains screens and other commands related to the overall system, while the WRA and SRA files each contains screens and commands related to a particular module. Only one example of each of the WRA and SRA files is included in the microfiche appendix, but only the data is different in the other files.

The computer software code related to input of elemental task times appear at lines 253-267 of the TOP file. The input of the test path data corresponds to lines 161-249 of the TOP file and the input of the hierarchical relationship or family tree corresponds to lines 560-564 of TOP. The input of the failure modes and the failure rates is one of the primary functions of the SRA files and a significant portion of this input is performed at lines 159-235 of the SRA file in the microfiche appendix.

The input screens provided by the computer software enable the engineering team to input test path data identifying all of the methods of fault detection and isolation used in the unique test path corresponding to each test path identifier and elemental task times of steps and procedures performed when each of the test paths is completed. As noted above, failure modes and failure rates are preferably associated only with the lowest level modules since the highest level modules are a collection of lower level modules and essentially only loose connections of the lower level modules could occur in the higher level modules. However, if desired, failure modes and failure rates can be input for all module levels. Furthermore, an elemental task time may be associated with any level module since disassembly begins with higher level modules and works its way down to the lowest level module which is to be replaced and reassembly also requires that tasks be performed on different levels of modules. Failure rate data associated with the higher level modules can be calculated from the failure rate data for lower level modules associated therewith.

Once all of the data has been input, the procedure according to the present invention consolidates the data in several ways. First, a total low level module failure rate is calculated 38 for each method which can be applied during fault isolation along each of the test paths which isolate that replaceable item. For example, the data in TABLE 1 is preferably totaled to produce TABLE 2. These totals are calculated in the implementation disclosed in the appendix at lines 135-140 of the SRA file. The column headed DETECTION in TABLE 2 contains the totals for each testing method, while the column headed by ISOLATION corresponds to the failure rates identified by the paths in the columns of TABLE 1.

TABLE 2
RI-5 INTERMEDIATE CALCULATION

| TESTING METHOD | DETECTION | TEST PATH | ISOLATION |
|---|---|---|---|
| On & Off-Line | 32.606 | 102 | 0.000 |
|  |  | 103 | 12.784 |
|  |  | 105 | 0.381 |
|  |  | 106 | 19.441 |
| On-Line Only | 0.000 | 101 | 0.000 |
|  |  | 104 | 0.000 |
| Off-Line Only | 0.000 |  |  |
| Manual | 2.163 | 107 | 1.853 |
|  |  | 108 | 0.310 |

Failure Rate - Relevant: 34.960, with Non-Relevant: 36.418

In addition to totalling the failure rate detected by a particular testing method, when a single test path, such as test path 106, isolates more than one failure mode of a module, the failure rates of those failure modes are multiplied by the percent failure contribution, totalled and recorded in the ISOLATION column of TABLE 2. This represents the total failure rate for each test path/module. In most cases, this number corresponds to the failure rate of a particular failure mode of one of the modules. For example, the first two lines of TABLE 1 indicate that test paths 103 and 107 isolate only a single failure mode in module RI-5 and 100% of the failure contribution is isolated. On the other hand, 90% of the memory bank failure rate is isolated by test path 106 which also isolates 100% of the driver failure rate and the last column of row four of TABLE 3 reflects the 90% contribution of the memory bank's failure rate and the 100% contribution of the driver failure rate.

Next, the data in the isolation column of TABLE 2 (or the failure rate column of TABLE 1) for each of the lowest level modules (SRAs) in each of the next higher level modules (WRAs) are combined into a single table, like that illustrated in TABLE 3, for each WRA. This combining of data is implemented in each of the WRA files at, e.g., lines 87-110 of the WRA file in the microfiche appendix. As illustrated in TABLE 3, the resulting table is likely to be relatively sparse, i.e., less than half of the matrix elements have values. Ideally, each test path would isolate only a single replaceable item or module. However, the procedure according to the present invention allows for ambiguity in fault isolation and thus includes test path 107 which results in manually testing each of the five replaceable items in the WRA module. On the other hand, test path 108 requires only the replacement of module RI-5 as indicated in the last line of TABLEs 1, 2 and 3.

TABLE 3

| TYPE OF TEST | TEST PATH | FAILURE RATE ISOLATED BY TEST PATH | | | | |
|---|---|---|---|---|---|---|
|  |  | RI 1 | RI 2 | RI 3 | RI 4 | RI 5 |
| On & Off-Line | 102 | 1.864 |  | 15.719 | 2.450 |  |
|  | 103 |  | 1.345 |  |  | 12.784 |
|  | 105 |  | 5.964 | 18.045 |  | 0.381 |
|  | 106 | 0.767 |  |  |  | 19.441 |
| On-Line | 101 | 0.627 | 15.844 |  | 0.345 |  |
|  | 104 |  |  |  | 24.769 |  |
| Off-Line Manual | 107 | 0.318 | 0.318 | 0.318 | 0.318 | 1.853 |
|  | 108 |  |  |  |  | 0.310 |

One of the features of the present invention is that the data in the sparse matrix of TABLE 3 is sorted 40 in descending order by the total failure rate for each test path/module within each WRA module. The result of this ordering is a matrix like that in TABLE 4. Using such a table, an order for repair of the modules having the failure modes detected by the test paths can be output. As a result, when test path 102 is traversed, for example, three modules (RI-1, RI-3 and RI-4) have been isolated. These modules form what is termed an ambiguity group. Module RI-3 should always be the first one replaced because it is over six times as likely to fail as either of the other two modules. This part of the procedure has been implemented in lines 130-165 of the WRA file in the microfiche appendix.

TABLE 4

| TEST PATH | RIs -IN ORDER OF LIKELIHOOD OF FAILURE | | | | | | | | | |
|---|---|---|---|---|---|---|---|---|---|---|
|  | 1st RI | FAIL RATE | 2nd RI | FAIL RATE | 3rd RI | FAIL RATE | 4th RI | FAIL RATE | 5th RI | FAIL RATE |
| 102 | 3 | 15.719 | 4 | 2.450 | 1 | 1.864 |  |  |  |  |
| 103 | 5 | 12.784 | 2 | 1.345 |  |  |  |  |  |  |
| 105 | 3 | 18.045 | 2 | 5.964 | 5 | 0.381 |  |  |  |  |
| 106 | 5 | 19.441 | 1 | 0.767 |  |  |  |  |  |  |
| 101 | 2 | 15.844 | 1 | 0.627 | 4 | 0.345 |  |  |  |  |
| 104 | 4 | 24.769 |  |  |  |  |  |  |  |  |
| 107 | 5 | 1.853 | 1 | 0.318 | 2 | 0.318 | 3 | 0.318 | 4 | 0.318 |
| 108 | 5 | 0.310 |  |  |  |  |  |  |  |  |

The ordered total test path/module failure rates in TABLE 4 is also used to calculate testability parameters 42. One of the testability parameters is percentage of repair actions successfully completed after the i-th replacement regardless of the number of modules in the ambiguity group. Typically, system specifications will require that a certain percentage of faults be corrected by replacing a single module, with a larger percentage repaired by replacing two modules, three modules, etc. The percentage of successful failure isolation is an indicator of the degree of ambiguity in the testing procedure. The ordering of the modules which results in data in the format of TABLE 4 assures the highest possible percentages of successful failure isolation. These percentages are often required to be calculated for each method of failure detection.

An example of how percentages of successful repair actions can be output by the procedure according to the present invention appears in TABLE 5. The test paths which can be performed by on-line testing include test paths 101-106. Using the values in TABLE 4, the sum of the first column of failure rates associated with test paths 101-106 divided by the total of all failure rates in TABLE 4 indicates that the percentage of successful failure isolation for on-line automatic tests is 86.12% as indicated in row 3, column 1 of TABLE 5. The percentage of successful on-line fault isolation when at most two replaceable items are replaced, is similarly calculated by totalling the first and second columns of the failure rates in TABLE 4 for test paths 101–106 and dividing by the total of the failure rates in TABLE 4. This results in the percentage 95.13% as indicated in TABLE 5, row 4, column 1. The remaining fault isolation percentages in TABLE 5 are calculated in a similar fashion.

TABLE 5

|  | On-Line Automatic | Off-Line Automatic | Subtotal Automatic | Manual | Total Auto and Manual |
|---|---|---|---|---|---|
| Fault Detection | | | | | |
| Relevant | 95.06% | 62.21% | 95.06% | 2.71% | 97.78% |
| Non-Relevant | 90.73% | 59.38% | 90.73% | 2.59% | 93.32% |
| Fault Isolation | | | | | |
| to 1 RI | 86.12% | 53.31% | 86.12% | 1.75% | 87.87% |
| to 2 RIs | 95.13% | 61.82% | 95.13% | 2.00% | 97.14% |
| to 3 RIs | 97.23% | 63.63% | 97.23% | 2.26% | 99.49% |
| to 4 RIs | 97.23% | 63.63% | 97.23% | 2.52% | 99.74% |
| to 5 RIs | 97.23% | 63.63% | 97.23% | 2.78% | 100.00% |

Another testability parameter often required to be generated during the development of a complex system is fault detection percentage. This parameter is also indicated in TABLE 5. Two percentages for each method of testing is given. As indicated in TABLE 1, some failure modes are not relevant. These non-relevant failure modes are included in the total failure rate for module RI-5 at the bottom of TABLE 2. Although not indicated in TABLEs 3 and 4, the total failure rate including non-relevant methods from each of the lower level modules in a higher level module are summed and can be used as the basis for determining relevant and non-relevant fault detection percentages shown in TABLE 5. The testability parameters are easily generated in the implementation after the sorting is completed as indicated by lines 383–396 of the WRA file in the microfiche appendix.

Maintainability parameters can also be produced 44 by the procedure according to the present invention. The elemental task times 31 input 36 as illustrated in FIG. 2 are used to construct 46 time lines of maintenance procedures to be performed in response to traversing each of the test paths using the order of replaceable items previously determined (see TABLE 4). The total time for executing each time line is multiplied times the failure rate of the mode that caused that path to be traversed. The sum of these times is the mean time to repair. This calculation can be performed in many different ways and some are set forth in PROCEDURE V.B of MIL-HDBK-472 and in lines 166–198 (particularly lines 178–184) of the WRA file in the microfiche appendix.

In a system composed of only a single level of modules, no further calculations are performed. In the two-level implementation found in the microfiche appendix, the failure rates of the lowest level modules (SRAs) in each of the next highest level modules (WRAs) can be used to produce testability and maintainability parameters for the entire system at the highest maintenance level. Thus, the steps in the procedure represented by TABLEs 3–5 are repeated so that the maintainability and testability parameters of the entire system can be calculated. In more complex systems, the procedure is repeated for as many maintenance levels as exist in the hierarchical relationship between the modules, by starting at the lowest level and using the data generated at that level for the next level.

The many features and advantages of the present invention are apparent from the detailed specification, and thus it is intended by the appended claims to cover all such features and advantages of the procedure which fall within the true spirit and scope of the invention. Further, since numerous modifications and changes will readily occur to those skilled in the art from the disclosure of this invention, it is not desired to limit the invention to the exact construction and operation illustrated and described, accordingly, suitable modifications and equivalents may be resorted to, all falling within the scope and spirit of the invention.

What is claimed is:

1. A process for automatically determining at least one of testability and maintainability parameters of a system composed of modules, comprising the steps of:
   (a) inputting failure rate data specifying a failure rate for at least one failure mode of at least one module, detected by each test path performable during testing of the system;
   (b) automatically ordering the modules for each of the failure modes detected by each test path in descending order of the failure rate corresponding thereto; and
   (c) identifying, for each test path, an order for iterative repair of the modules for each of the failure modes detected by the test path, in dependence upon said ordering in step (b).

2. A process as recited in claim 1, further comprising the step of (d) calculating testability parameters including percentage of successful failure isolations requiring only positive integer numbers of iterative replacements, in dependence upon said ordering in step (b).

3. A process as recited in claim 1,
   further comprising the step of (d) inputting module relationship data defining a hierarchical relationship between the modules, the hierarchical relationship corresponding to organization of maintenance for the system, and
   wherein step (a) consists of inputting the failure rate data for lowest level modules only.

4. A process as recited in claim 3, further comprising the step of (e) calculating the failure rate data for higher level modules from the failure rate data for lower level modules associated therewith.

5. A process as recited in claim 3,
   wherein step (a) comprises the steps of:
   (ai) displaying input screens for each of the lowest level modules, the input screens including fields for failure mode, failure rate, percent failure contribution, method of fault detection/isolation and test path identifier; and (a2) inputting data for each of the fields corresponding to each failure mode of the lowest level modules, and wherein said process further comprises the step of (e) calculating a percentage of fault isolation of the system accomplishable using each method of testing applied to the system and requiring replacement of n modules, where n is an integer, said calculating being performed for n equals one and meaningful incremental increases up to the number of modules in the system.

6. A process as recited in claim 1,
further comprising the step of (d) producing a test flow diagram having branching nodes representing diagnostic tests not requiring reassembly, and
wherein the test paths correspond to all termination nodes in the test flow diagram.

7. A process as recited in claim 1, wherein a plurality of methods can be used to perform fault isolation, and
wherein said process further comprises the step of (d) identifying at least one of the methods as being applied in each of the test paths.

8. A process as recited in claim 7, wherein the methods include on-line automatic, off-line automatic and manual tests, and
wherein step (d) includes identifying the test paths applying more than one of the methods.

9. A process as recited in claim 7, further comprising the step of (e) totaling the failure rates for the failure modes of each of the modules detected using each of the methods.

10. A process as recited in claim 7, further comprising the step of (e) calculating a percentage of fault isolation of the system accomplishable using each of the methods and requiring replacement of n modules according to said ordering in step (b), said calculating being performed for n equal to each integer from one up to a predetermined number.

11. A process as recited in claim 10,
wherein at least one of the tests paths isolates more than one of the modules included in at least one ambiguity group, and
wherein the predetermined number used in step (e) equals a largest number of the modules in the at least one ambiguity group.

12. A process as recited in claim 1, further comprising the steps of:
(d) inputting maintenance task data specifying elemental task times of steps in procedures performed when each of the test paths is completed; and
(e) calculating maintainability parameters in dependence upon said ordering in step (b) and the elemental task times specified in step (d).

13. A process for automatically determining at least one of testability and maintainability parameters of a system composed of modules testable using a plurality of methods of fault detection and isolation, comprising the steps of:
(a) displaying an input screen for at least one module to provide fields for input of failure mode, failure rate, percent failure contribution, method of fault detection/isolation and test path identifier;
(b) inputting failure data for all of the failure modes of the at least one module using the input screen displayed in step (a);
(c) calculating a percentage of fault isolation of the system accomplishable using each of the methods and requiring replacement of n modules, said calculating being performed for n equal to each integer from one up to a predetermined number.

14. A process as recited in claim 13, further comprising the steps of:
(d) automatically ordering the failure modes detected by each test path in descending order of the failure rate corresponding thereto; and
(e) outputting, for each test path, an order for repair of the modules having a failure mode detected by the test path, in dependence upon said ordering in step (d).

15. A process as recited in claim 14, wherein the methods include on-line automatic, off-line automatic and manual tests, and
wherein step (b) includes identifying more than one of the methods as being used in at least one of the test paths identified by a corresponding test path identifier.

16. A process as recited in claim 15, further comprising the step of (f) totaling the failure rates for the failure modes of each of the modules detected using each of the methods associated with each corresponding test path identifier.

17. A process as recited in claim 16,
further comprising the step of (g) inputting module relationship data defining a hierarchical relationship between the modules, the hierarchical relationship corresponding to organization of maintenance for the system, and
wherein steps (a) and (b) are performed only for lowest level modules.

18. A process as recited in claim 17, further comprising the step of (h) calculating testability parameters including percentage of successful failure isolations requiring only n module replacements in dependence upon said ordering in step (d), said calculating being performed for n equal to each integer from one up to a predetermined number.

19. A process for automatically determining testability and maintainability parameters of a system composed of modules testable using a plurality of methods of fault detection and isolation, comprising the steps of:
(a) producing a test flow diagram having branching nodes representing diagnostic tests not requiring reassembly and termination nodes represented by a test path identifier, each corresponding to a unique test path through the test flow diagram;
(b) inputting test path data identifying all of the methods of fault detection and isolation used in the unique test path corresponding to each test path identifier;
(c) inputting module relationship data defining a hierarchical relationship between the modules, including highest and lowest levels of the hierarchical relationship, the hierarchical relationship corresponding to organization of maintenance for the system;
(d) displaying input screens for each of the modules in the lowest level of the hierarchical relationship, each input screen providing fields for input of a failure mode, a failure rate, percent failure contribution, at least one method of fault detection/isolation and a test path identifier;
(e) inputting failure data corresponding to all of the failure modes of each of the modules in the lowest level of the hierarchical relationship, using the input screens displayed in step (a);

(f) inputting maintenance task data specifying elemental task times of steps and procedures performed when each of the test paths is completed;

(g) calculating a total test path/module failure rate corresponding to all of the failure modes, isolated by each of the test paths;

(h) automatically ordering the modules corresponding to the failure modes detected by each of the test paths in descending order of the total test path/module failure rate calculated in step (f);

(i) outputting, for each test path, an order for repair of the modules having the failure mode detected by the test path, in dependence upon said ordering in step (g);

(j) calculating testability parameters including percentage of successful fault isolations requiring only n module replacements in dependence upon said ordering in step (g), said calculating being performed for n equal to each integer from one up to a predetermined number;

(k) automatically producing time lines of maintenance procedures to be performed in response to traversing each of the test paths, using the maintenance task data input in step (f), with multiple time lines produced for each of the test paths isolating a plurality of modules, the plurality of time lines incrementally adding modules according to said ordering in step (g);

(l) calculating maintainability parameters in dependence upon said time lines produced in step (k); and (m) repeating steps (h)–(l) for at least one level of modules higher than the lowest level of modules in the hierarchical relationship.

* * * * *